(12) United States Patent
Guertin et al.

(10) Patent No.: US 6,239,617 B1
(45) Date of Patent: May 29, 2001

(54) MIXED VOLTAGE OUTPUT DRIVER WITH AUTOMATIC IMPEDANCE ADJUSTMENT

(75) Inventors: David LeRoy Guertin; Robert Russell Williams; Daniel Guy Young; Joseph James Cahill, all of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/434,861

(22) Filed: Nov. 4, 1999

(51) Int. Cl.[7] .............................................. H03K 19/0175
(52) U.S. Cl. ................. 326/81; 326/30; 326/87; 326/86
(58) Field of Search .................................. 326/80, 81, 83, 326/86, 87, 30

(56) References Cited

U.S. PATENT DOCUMENTS

| | | |
|---|---|---|
| 5,151,619 | 9/1992 | Austin et al. . |
| 5,306,965 * | 4/1994 | Asprey .................................. 326/87 |
| 5,559,447 * | 9/1996 | Rees ...................................... 326/87 |
| 5,565,749 * | 10/1996 | Porter .................................... 326/81 |
| 5,825,206 * | 10/1998 | Krishnamurthy et al. ............. 326/81 |
| 6,130,556 * | 10/2000 | Schmitt et al. ........................ 326/81 |

* cited by examiner

Primary Examiner—Michael Tokar
Assistant Examiner—Don Phu Le
(74) Attorney, Agent, or Firm—Bracewell & Patterson LLP

(57) ABSTRACT

A mixed voltage output driver includes an output sensing circuit that senses an output voltage at an output terminal and generates a voltage signal that corresponds to a voltage level at the output terminal. Next, an impedance selection circuit receives the voltage signal and generates a control signal in response to the output voltage having a higher logical uplevel than the mixed voltage output driver. The control signal is then received by an adjustable drive impedance circuit that is also coupled to an input terminal of the mixed voltage output driver and, in response thereto, the adjustable drive impedance circuit modifies an output drive impedance of the mixed voltage output driver. In another advantageous embodiment, the mixed voltage output driver only determines if the output voltage at the output terminal is at a logical uplevel before adjusting the output drive impedance.

21 Claims, 3 Drawing Sheets

MIXED VOLTAGE OUTPUT DRIVER WITH AUTOMATIC IMPEDANCE ADJUSTMENT

BACKGROUND OF THE INVENTION

1. Technical Field of the Invention:

The present invention relates generally to interface circuitry for low voltage digital technologies and in particular to output drivers. Still more particularly, the present invention a mixed voltage output driver with automatic impedance adjustment.

2. Description of the Related Art:

Efforts to decrease the size, increase the speed and reduce the power consumption of electrical circuits have created the need for low voltage silicon construction. Lower voltage requirements result in lower power consumption which complements, e.g., battery powered, portable electronics.

With advances in semiconductor fabrication techniques, the size of electronic devices has been reduced to the sub-micron level and the voltage requirements of these devices have been reduced significantly. Nevertheless, when a new low-voltage integrated circuit (IC) technology is developed, it is often desirable for that new technology to be able to operate with existing relatively high-voltage circuitry. The voltage of a particular technology is typically defined by the gate-oxide breakdown voltage and/or the punch-through between the source and drain.

As a result of the differing IC technologies, there are occasions when interfaces between "chips" occur where different chips drive different uplevel, i.e., logical high, voltages. For example, one driver circuit may drive the wire, i.e., interconnection, to an uplevel voltage of 2.0V. After this driver has driven the wire, it could tristate, i.e., go into a high impedance mode, relinquishing its turn on the wire. At this time, a second driver circuit on the wire may drive the wire to a 1.5V uplevel. In this example, the receivers on the wire would probably have logic thresholds of about 0.9V or 1.0V.

A problem, however, may arise when driving the interconnection from a "higher high" to a "lower high" if the second driver's impedance is too low. If the impedance of the driver that is trying to establish the 1.5V uplevel (in the above example) is too low, the signal on the wire will significantly undershoot the 1.5V level enough to make a designated receiver erroneously switch, or at the minimum, reduce the signal margin at the receiver below safe limits. Simulations have shown that a driver, with an uplevel of 1.5V minus a supply tolerance, in its lower impedance mode, e.g., 20 ohms, would cause the signal received at a receiver to drop to about 1.0V. On the other hand, the same driver in a higher impedance mode, e.g., 40 ohms, would provide a 1.25V signal at the receiver. An even higher impedance driver will drive the net at an even higher voltage uplevel.

Accordingly, what is needed in the art is an improved driver circuit that overcomes or mitigates the above discussed limitations.

SUMMARY OF THE INVENTION

It is therefore an object of the present invention to provide an improved output driver.

It is yet another object of the present invention to provide a mixed voltage output driver with automatic impedance adjustment.

To achieve the foregoing object, and in accordance with the invention as embodied and broadly described herein, a mixed voltage output driver is disclosed. The mixed voltage output driver includes an output sensing circuit that senses an output voltage at an output terminal and generates a voltage signal that corresponds to a voltage level at the output terminal. Next, an impedance selection circuit receives the voltage signal and generates a control signal in response to the output voltage having a higher logical uplevel than the mixed voltage output driver. The control signal is then received by an adjustable drive impedance circuit that is also coupled to an input terminal of the mixed voltage output driver and, in response thereto, the adjustable drive impedance circuit modifies an output drive impedance of the mixed voltage output driver. In another advantageous embodiment, the mixed voltage output driver only determines if the output voltage at the output terminal is at a logical uplevel before adjusting the output drive impedance.

The present invention discloses a novel output driver circuit that automatically adjusts its output drive impedance depending on the voltage level that is present on an interconnection that it is connected to. Consequently, the problems associated with multiple output drivers having different logical uplevel voltages on the same interconnection are substantially reduced or eliminated.

The present invention further includes an input buffer, coupled to the input terminal of the output driver that comprises first and second inverters. First and second inverters, as is well known in the art, provide an buffer and high gain stage for an incoming Data signal. In a related embodiment, the output driver is embodied in an integrated circuit (IC).

In one embodiment of the present invention, the output sensing circuit is a noninverting receiver. Those skilled in the art should readily appreciate that if the implementation technology supports devices that can tolerate higher voltages, the noninverting receiver could be simplified or even eliminated. Thus, in other advantageous embodiments, the output terminal of the output driver may be directly coupled to the impedance selection circuit.

In another embodiment of the present invention, the impedance selection circuit includes a latch and a "set and reset" circuit. The set and reset circuit has an output coupled to an input of the latch and adjusts an output of the latch, in response to a voltage signal received at an input of the set and reset circuit. In a related embodiment, the output of the latch is provide to a NAND gate that performs a Boolean logic function. It should be readily apparent to those skilled in the art that the latch may also be set by other boolean equivalents, as would be obvious to those familiar with boolean implementations.

In yet another embodiment of the present invention, the adjustable drive impedance circuit raises a resistance value of the output drive impedance. In an advantageous embodiment, the resistance value of the output drive impedance is raised from twenty ohms to forty ohms. Of course these resistance values are arbitrary and the present invention does not contemplate limiting its practice to any particular set of resistances for the output drive impedance of the output driver.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

DESCRIPTION OF THE DRAWINGS

For a more complete understanding of the present invention, reference is now made to the following descriptions taken in conjunction with the accompanying drawings, in which.

DETAILED DESCRIPTION

Figure 1:
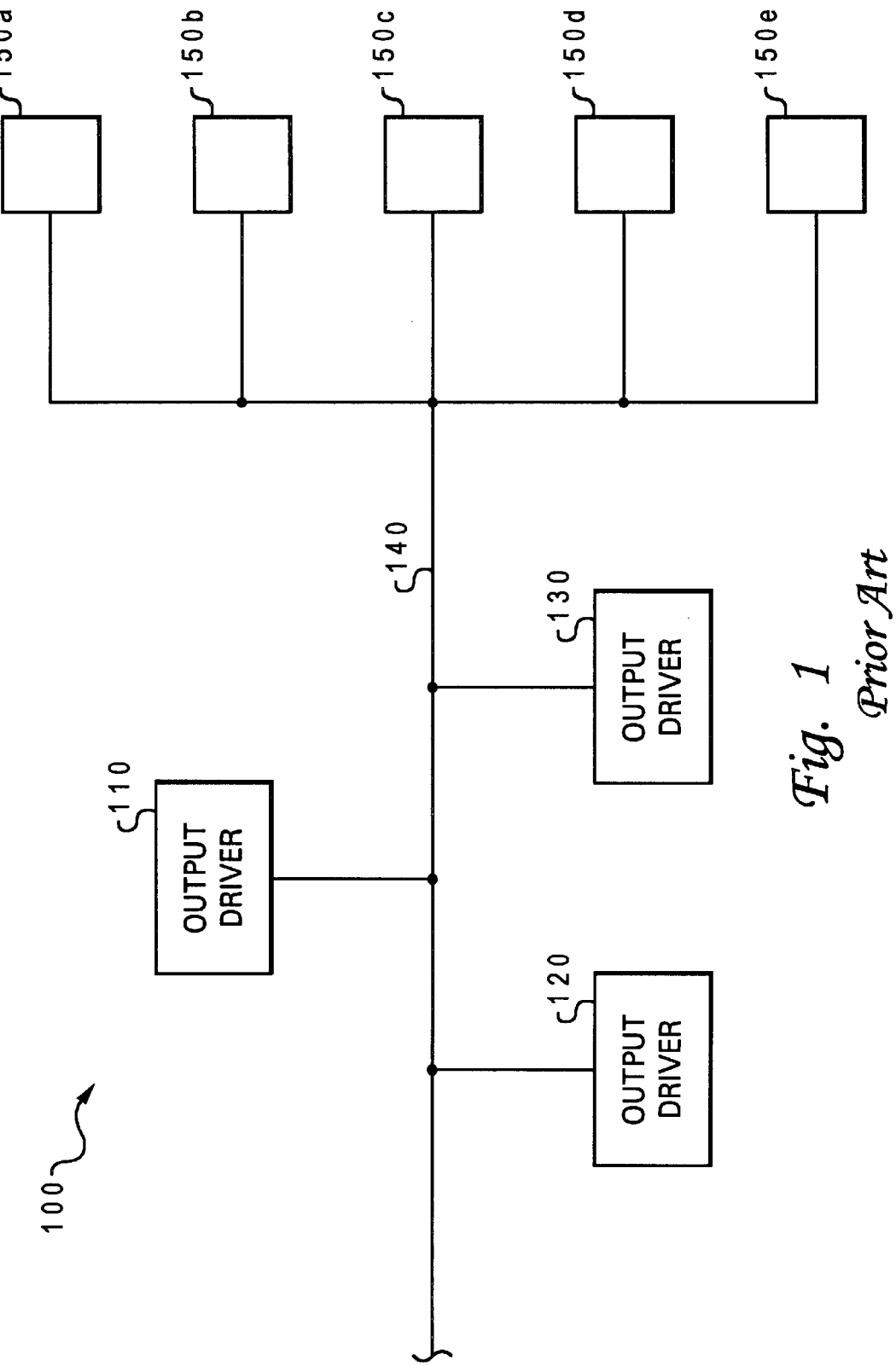
FIG. 1 illustrates a high-level simplified block diagram of an exemplary circuit utilizing a plurality of output drivers having different voltage levels to drive a plurality of receivers.

With reference now to the figures, and in particular, with reference to FIG. 1, there is depicted a high-level simplified block diagram of an exemplary circuit 100 utilizing a plurality of output drivers having different voltage levels to drive a plurality of receivers. Circuit 100 includes first, second and third output drivers 110, 120, 130 that are implemented with different integrated circuit (IC) technologies to drive a plurality of receivers, designated 150a–150e. For example, first output driver 110 may drive a transmission line of an interconnection 140 to an uplevel of 1.5V, whereas second and third output drivers 120, 130 may drive interconnection 140 to an uplevel of 2.0V. It should be noted that each node in circuit 100 may be a driver, receiver or both.

As discussed previously, problems may arise when driving interconnection 140 from a "higher high" to a "lower high," if the second driver's impedance is too low. For example, after second output driver 120 has driven interconnection 140 to an 2.0V uplevel, if the impedance of first output driver 110 that is trying to establish the 1.5V uplevel is too low, the signal on interconnection 140 will significantly undershoot the 1.5V level enough to make a designated receiver erroneously switch, or at the minimum, reduce the signal margin at the designated receiver below safe limits.

Figure 2:
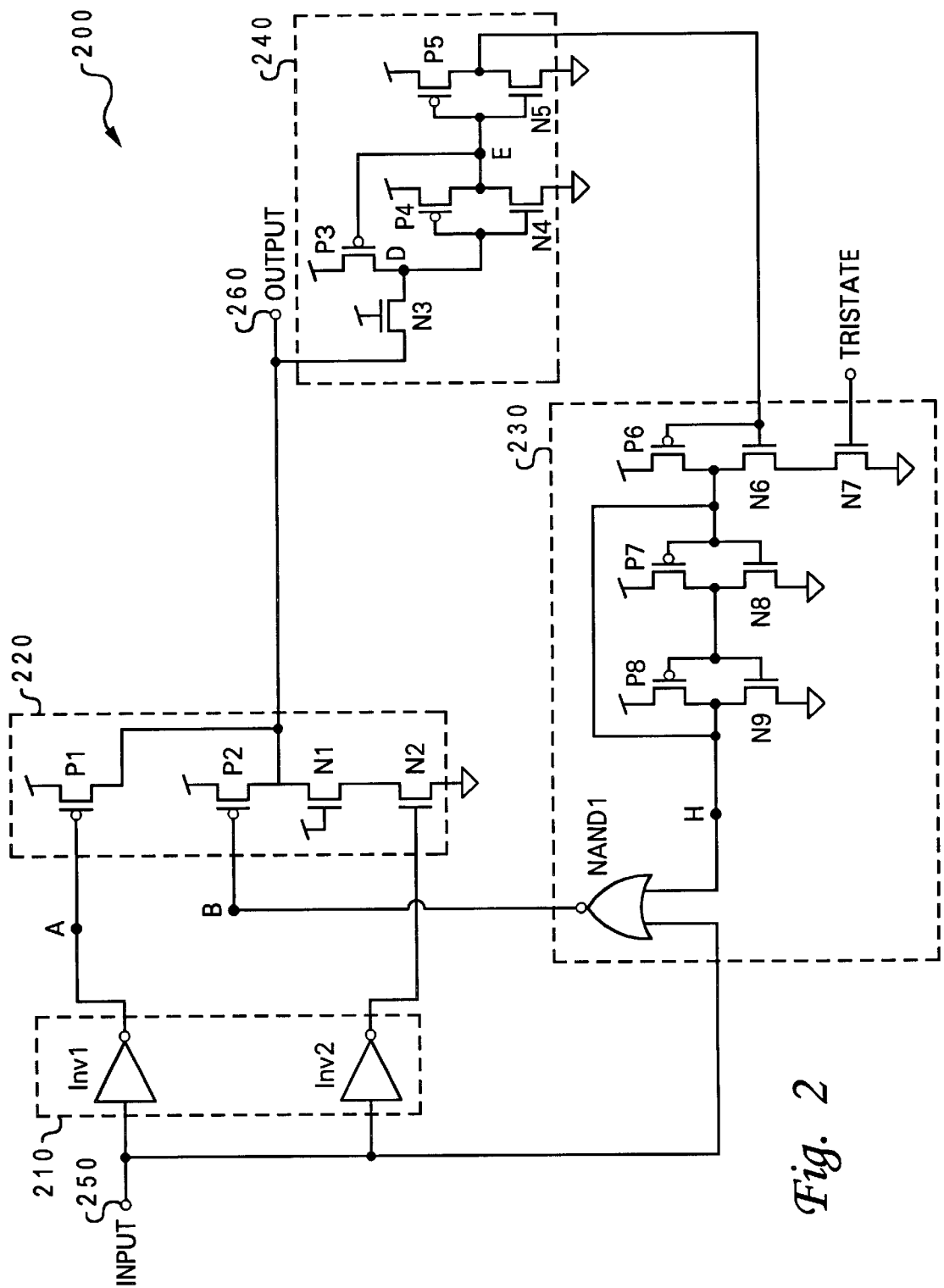
FIG. 2 illustrates a simplified schematic diagram of an embodiment of a mixed voltage output driver constructed according to the principles disclosed by the present invention.

Referring now to FIG. 2, there is illustrated a simplified schematic diagram of an embodiment of a mixed voltage output driver 200 constructed according to the principles disclosed by the present invention. Output driver 200 includes an input buffer 210, an adjustable drive impedance circuit 220, an impedance selection circuit 230 and an output sensing circuit 240. The output driver 200, in an advantageous embodiment, is embodied in an integrated circuit (IC). It is also assumed for the purposes of describing the operation of output driver 200 that the field effect transistors (FETs) utilized in the illustrated implementation can tolerate voltages only up to a supply voltage Vdd of 1.5V.

Input buffer 210 includes first and second inverters Inv1, Inv2 that function as a high gain stage for a data signal received at an input terminal 250. First and second inverters Inv1, Inv2 are predrivers to adjustable drive impedance circuit 220, specifically a first PFET P1 and a second NFET N2, and also provide slew rate control (not shown) through conventional means well known in the art.

Adjustable drive impedance circuit 220 also includes a second PFET P2 and a first NFET N1. In the illustrative embodiment, first and second NFETs N1, N2 are conventional NFET pulldown driver devices. They are stacked, i.e., connected in series, with the top device's, i.e., first NFET N1, gate tied to a 1.5V supply voltage to reduce a drain to source voltage (Vds) stress. This arrangement is required because the output will be pulled above the implementation technology's normal supply voltage Vdd. It should be noted that the 1.5V supply voltage utilized in output driver 200 is an exemplary value and that other supply voltages may also be employed. Those skilled in the art should readily recognize that the supply voltage is dependent on the technology used to implement the output driver. Since the field effect transistor (FET) devices can only tolerate 1.5V, first NFET N1 is used to divide the voltage stress across first and second NFETs N1, N2. Second NFET N2 cannot tolerate a 2.0V drain to source voltage (Vds) without suffering voltage breakdown or hot carrier problems. With first NFET N1 configured as a "source follower" with its gate tied to 1.5V, its source terminal will not get higher than a NFET threshold voltage (Vtn) of about 0.5V below 1.5V, or about 1.0V maximum. Thus, if the voltage at output terminal 260 is at 2.0V, there will be approximately 1.0V across first NFET's N1 drain and source terminals and also approximately 1.0V across second NFET's N2 drain and source terminals. It should also be noted first and second PFETs P1, P2 do not have this problem. Since their source terminals are tied to 1.5V and when the output is at 2.0V, there will only be 0.5V across their drain and source terminals. Furthermore, if second NFET N2 is implemented with a device that can tolerate higher voltages, first NFET N1 would not be required.

In the illustrated embodiment, the impedance of first and second NFETs N1, N2, along with any series resistance between them and an output terminal 260, is assumed to be 20 ohms. Of course, sizing first and second NFETs N1, N2 and adding additional resistors allows for any impedance value to be realized. First and second PFETs P1, P2 are coupled in parallel and, for the purposes of the present discussion, the impedance of each (along with any associated resistances) will be 40 ohms. Thus, if first PFET P1 is driving an interconnection, or net, at output terminal 260 by itself, the resulting drive impedance of output driver 200 will be 40 ohms. If both first and second PFETs P1, P2 are actively pulling the output up, the resulting drive impedance of output driver 200 will be 20 ohms. It should also be emphasized again that the value of the drive impedance is selectable and can be set at any value by selecting the appropriate devices and resistances.

Output sensing circuit 240 includes a noninverting receiver comprising of third, fourth and fifth PFETs P3, P4, P5 along with third, fourth and fifth NFETs N3, N4, N5. Third NFET N3 is coupled to output terminal 260 and is employed to limit the voltage at a node D. Specifically, the voltage signal generated by the output sensing circuit 240 is provided to the gates of a sixth PFET P6 and a sixth NFET N6 that along with a seventh NFET N7 make up a set and reset circuit. It should be noted that the design implementation shown in the illustrated embodiment assumes that all the FET devices can only tolerate a supply voltage of 1.5V. If the technology supports devices that can tolerate higher voltages, the noninverting receiver circuitry could be simplified or even eliminated. In this case, output terminal 260 can be directly connected to the gates of sixth PFET P6 and sixth NFET N6 directly.

Impedance selection circuit 230 also includes a latch comprising seventh and eighth PFETs P7, P8 and eighth and ninth NFETs N8, N9. It should be readily apparent to those skilled in the art that the latch may also be set by other boolean equivalents, as would be obvious to those familiar with boolean implementations. The input, or DATA, signal received at input terminal 250, along with the output of the latch, are provided as input signals to a gate NAND1 that performs a Boolean logic function, i.e., NAND, to generate a control signal. The control signal is provided to impedance selection circuit 220, specifically, to the gate of second PFET P2. The control signal is utilized to control the switching of second PFET P2 that, in turn, changes the drive impedance of output driver 200.

Also shown in the illustrated embodiment is a Tristate signal coupled to the gate of seventh NFET N7. As discussed earlier, when output driver 200 relinquishes its control of the bus, it asserts a tristate signal. Asserting the tristate signal also places output driver 200 is in a high impedance mode. For ease of explanation, the tristate control to first and second inverters Inv1, Inv2 and gate NAND1 are not depicted in the simplified schematic of the illustrated embodiment. However, it should be readily apparent to those skilled in the art that boolean implementations to implement the tristate condition are well known in the art. For example, in a more complete output driver 200 schematic, first inverter Inv1 is a NAND gate, second inverter Inv2 is a NOR gate and gate NAND1 becomes a 3-way NAND. Thus, when a tristate signal is asserted, the outputs of first and second inverters Inv1, Inv2 and gate NAND1 are high, low and high, respectively, independent of the Data signal at input terminal 250. Consequently, first and second PFETs P1, P2 and first and second NFETs N1, N2 are nonconducting and output driver 200 appears as an open circuit.

The operation of output driver 200 will hereinafter be described in greater detail with respect to the following conditions: (1) the bus is "low" and output driver 200 is enabled to drive "high," (2) output driver 200 has driven the bus "high" and is still enabled, (3) output driver 200 gives up the bus to another driver, (4) output driver 200 regains bus ownership and drives the bus "high" and (5) output driver 200 drives the bus low.

1. With the voltage at output terminal 260 at logical low, i.e., at ground voltage, node D is low that, in turn, drives node E high. The high signal at the gates of fourth PFET P4 and fourth NFET N4 turns on turns on both devices driving node X low. The low signal, i.e., voltage signal, turns on sixth PFET P6, driving the output of the latch to a logical high at node H. A logical high "data" input at input terminal 250 switches node A low through first inverter Inv1 and also enables the output of gate NAND1, i.e., node B, low. With their gates pulled low, first and second PFETs P1, P2 are turned on. The paralleled impedance of first and second PFETs P1, P2 is significantly lower than the impedance of the bus coupled to output terminal 260. This is necessary if there are several loads, e.g., receivers, on the bus. First and second PFETs P1, P2 will pull the voltage on output terminal 260 (along with the rest of the bus) to Vdd, i.e., 1.5V. It should be noted that the Tristate signal at the gate of seventh NFET N7 is low, i.e., ground, since output driver 200 is enabled when it is driving the net. This signal keeps the stack of sixth and seventh NFETs N6, N7 from driving node H low as soon as the voltage at output terminal 260 goes above the logical switch point of noninverting receiver 240. Output driver 200 is required to have a lower drive impedance until the net becomes fully charged.

2. Output driver 200 has just driven the bus high with a lower drive impedance, i.e., 20 ohms. Additionally, since the Tristate signal has not gone high, the stack of sixth and seventh NFETs N6, N7 has yet to conduct. Node H remains high and both first inverter Inv1 and gate NAND1 pass the inverted data signal at input terminal 250 to the gates of first and second PFETs P1, P2. Consequently, both first and second PFETs P1, P2 are turned on and the bus is held high with a 20 ohms drive impedance.

3. Output driver 200 is now tristated, relinquishing control of the bus to another driver. With the voltage at output terminal 260 high due to another driver on the bus, node X is high. Along with the Tristate signal being high, the stack of sixth and seventh NFETs N6, N7 can now conduct pulling node H low and setting the latch.

4. Output driver 200 regains ownership of the bus and drives its output terminal 260 high. Since node H is now low, the output of gate NAND1 is driven low that, in turn, keeps second PFET P2 turned off. Node A is pulled low by the Data signal at input terminal 250, turning on first PFET P1. Output driver 200 drives output terminal to a 1.5V high, but only with a drive impedance of 40 ohms.

5. Output driver 200 drives the bus low. Since the stack of first and second NFETs N1, N2 is designed to drive the net with a 20 ohms, output terminal 260 and the bus is driven low with a 20 ohms drive impedance. Consequently, with output terminal 260 low, noninverting receiver 240 drives node X low, turning off sixth PFET P6 and sixth NFET N6. This results in node H being driven high. It should be noted that it did not really matter if output driver 200 or another driver on the net drove the bus low, node H will be driven high in either case.

Figure 3:
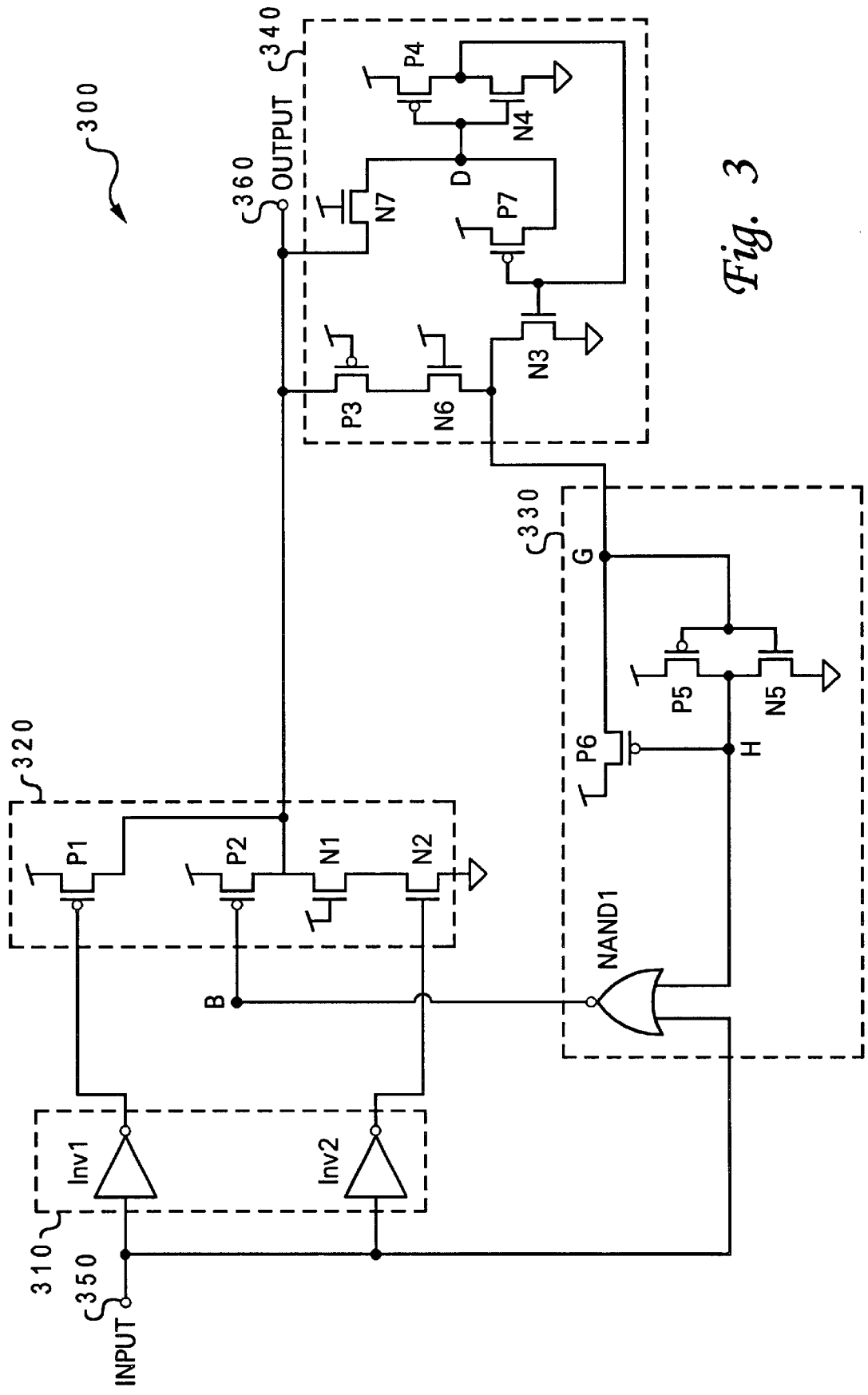
FIG. 3 illustrates a simplified schematic diagram of a second embodiment of a mixed voltage output driver constructed according to the principles disclosed by the present invention.

Referring now to FIG. 3, there is depicted a simplified schematic diagram of a second embodiment of a mixed voltage output driver 300 constructed according to the principles disclosed by the present invention. Output driver 300 includes an input buffer 310 that is coupled to an input terminal 350 and an adjustable drive impedance circuit 320. Input buffer 310 and adjustable drive impedance circuit 320 are analogous in function and construction to input buffer 210 and adjustable drive impedance circuit 220 illustrated in FIG. 2. Output driver 300 also includes an output voltage sensing circuit 340 coupled to an output terminal 360 and an selection circuit 330.

A third PFET P3 in output sensing circuit 340 is coupled to output terminal 360 and is preferably, in an advantageous embodiment, a low-threshold-voltage device. Additionally, if third PFET P3 is implemented in a silicon on insulator (SOI) technology, in a preferred embodiment, its body is connected to a supply voltage Vdd, i.e., 1.5V in the illustrated embodiment, in order to have its threshold values be most predictable. Third PFET P3 is utilized to turn on when an output voltage at output terminal 360 rises above Vdd. In the event that the output voltage at output terminal 360 is greater than Vdd, a voltage level at node G, i.e., a voltage signal, will be pulled sufficiently high enough to cause an inverter created by fifth NFET N5 and fifth PFET P5 in impedance selection circuit 330 to go low. This will, in turn, enable a sixth PFET P6, a weak half-latch device in impedance selection circuit 330, to pull the voltage at node G to the Vdd rail and hold it there, even if the output voltage falls to 1.5V and third PFET P3 stops conducting. When the voltage at node H is low, a gate NAND1 will produce a high enough signal at its output, i.e., node B, turning off second PFET P2. The output of gate NAND1 is a control signal provided to adjustable drive impedance circuit 320 to modify the drive impedance of output driver 300.

Node H will continue to remain low until such time as when output driver 300 or another driver on the net drives the voltage at output terminal 360 low enough to reset the half-latch sixth PFET P6. Third, fourth and seventh NFETs N3, N4, N7 in the output voltage sensing circuit 340 ensure that the voltage at node G is at a low 35 level when the voltage at output terminal 360 is low. Third NFET N3 is sized and selected to be strong enough to reset the half-latch defined by sixth PFET P6. It should be noted that seventh NFET N7 operates to limit the voltage on the gates of fourth PFET P4 and fourth NFET N4 devices. Seventh PFET P7 is also configured to operate as a half-latch that pulls a node D to the 1.5V rail and is a "weak" device relative to seventh NFET N7.

Third PFET P3, which is utilized to sense the voltage at output terminal 360, conducts, i.e., turns on, when the output voltage is sufficiently higher than Vdd to turn it on. PFET devices' threshold voltages are typically in the order of 200 mV and low-voltage PFET devices' threshold voltages are generally about 60 mV less, or about 140 mV. Alternatively, in other advantageous embodiments, alternative means may be used instead of third PFET P3 to accomplish generating the current needed to drive node G high enough to set the half-latch defined by sixth PFET P6. Although not shown or described, it will be necessary to utilize conventional means to prevent first and second PFETs P1, P2 from conducting backwards into supply voltage Vdd when the voltage on output terminal 360 rises above Vdd. As shown in the illustrated embodiment, first and second PFETs P1, P2 will conduct whenever the voltage on output terminal 360 rises above their threshold voltage above Vdd. Conventional techniques, e.g., a technique disclosed in U.S. Pat. No. 5,151,619, issued to Austin, et al., which is herein incorporated in its entirety by reference, may be advantageously employed to eliminate the problem described above.

The present invention may be embodied in other specific forms without departing from its spirit or essential characteristics. The described embodiments are to be considered in all respects as illustrative and not restrictive. The scope of the invention is, therefore, indicated by the appended claims rather than by the foregoing description. All changes which come within the meaning and range of equivalency of the claims are to be embraced within their scope.

What is claimed is:

1. A mixed voltage output driver, comprising:
    an input and an output terminal;
    an output sensing circuit that senses an output voltage at said output terminal and generates a voltage signal that corresponds to a voltage level at said output terminal;
    an impedance selection circuit that receives said voltage signal and generates a control signal in response to said output voltage having a higher logical uplevel than said mixed voltage output driver; and
    an adjustable drive impedance circuit, coupled to said input terminal, that receives said control signal and, in response thereto, modifies an output drive impedance of said mixed voltage output driver.

2. The mixed voltage output driver as recited in claim 1 further comprising an input buffer, coupled to said input terminal, said input buffer having first and second inverters.

3. The mixed voltage output driver as recited in claim 1 wherein said impedance selection circuit includes a Boolean logic function.

4. The mixed voltage output driver as recited in claim 1 wherein said modifying said output drive impedance includes raising a resistance value of said output drive impedance.

5. The mixed voltage output driver as recited in claim 4 wherein said resistance value of said output drive impedance is raised from twenty ohms to forty ohms.

6. The mixed voltage output driver as recited in claim 1 wherein said mixed voltage output driver is embodied in an integrated circuit (IC).

7. A mixed voltage output driver, comprising:
    an input and an output terminal;
    an output sensing circuit that senses an output voltage at said output terminal and generates a voltage signal that corresponds to a voltage level at said output terminal;
    an impedance selection circuit that receives said voltage signal and generates a control signal in response to said output voltage having a logical uplevel; and
    an adjustable drive impedance circuit, coupled to said input terminal, that receives said control signal and, in response thereto, modifies an output drive impedance of said mixed voltage output driver.

8. The mixed voltage output driver as recited in claim 7 wherein said output sensing circuit is a noninverting receiver.

9. The mixed voltage output driver as recited in claim 7 further comprising an input buffer, coupled to said input terminal, said input buffer having first and second inverters.

10. The mixed voltage output driver as recited in claim 7 wherein said impedance selection circuit comprises:
    a latch having an input and an output;
    a set and reset circuit having an output coupled to said input of said latch, said set and reset circuit for adjusting said output of said latch responsive to said voltage signal received at an input of said set and reset circuit.

11. The mixed voltage output driver as recited in claim 7 wherein said impedance selection circuit includes a Boolean logic function.

12. The mixed voltage output driver as recited in claim 7 wherein said modifying said output drive impedance includes raising a resistance value of said output drive impedance.

13. The mixed voltage output driver as recited in claim 12 wherein said resistance value of said output drive impedance is raised from twenty ohms to forty ohms.

14. The mixed voltage output driver recited in claim 7 wherein said mixed voltage output driver is embodied in an integrated circuit (IC).

15. A method for automatically adjusting an output drive impedance of a mixed voltage output driver having input and output terminals, comprising the steps of:
    sensing a voltage at said output terminal;
    determining, in response to said sensed voltage having a high voltage level, if said sensed voltage was driven high by another driver circuit having a higher logical uplevel; and
    adjusting said output drive impedance, in response to said determination that said sensed voltage was driven high by another driver circuit having a higher logical uplevel.

16. The method as recited in claim 15 wherein said step of adjusting said drive impedance includes raising a resistance value of said output drive impedance.

17. A method for automatically adjusting an output drive impedance of a mixed voltage output driver having input and output terminals, comprising the steps of:
    sensing a voltage at said output terminal;
    determining if said sensed voltage is at a logical uplevel and said mixed voltage output driver is in a high impedance mode; and adjusting said output drive impedance, in response to said determination that said sensed voltage is at a logical uplevel and said mixed voltage output driver is in a high impedance mode.

18. The method as recited in claim 17 wherein said step of adjusting said drive impedance includes raising a resistance value of said output drive impedance.

19. The method as recited in claim 17 wherein said step of sensing a voltage at said output terminal includes utilizing a noninverting receiver.

20. The method as recited in claim 17 wherein said step of determining if said sensed voltage is at a logical uplevel includes the step of setting a latch.

21. The method as recited in claim 20 wherein said step of adjusting said output drive impedance includes the step of combining an output of said latch and a voltage at said input terminal with a Boolean operation.

* * * * *